United States Patent [19]

Zhong et al.

[11] Patent Number: 5,349,695
[45] Date of Patent: Sep. 20, 1994

[54] SELECTIVE CALL RECEIVER HAVING CMOS POWER-ON RESET CIRCUIT

[75] Inventors: Zhong K. Zhong, Delray Beach; Barry W. Herold, Boca Raton, both of Fla.

[73] Assignee: Motorola, Inc., Schaumburg, Ill.

[21] Appl. No.: 984,827

[22] Filed: Dec. 3, 1992

[51] Int. Cl.5 .................. H04Q 3/02; H03K 17/30
[52] U.S. Cl. .................. 455/38.3; 455/343; 307/272.3; 307/296.5; 307/363
[58] Field of Search ............... 455/38.3, 343; 307/350, 307/363, 296.1, 296.5, 296.8, 272.3; 340/825.44, 311.1

[56] References Cited

U.S. PATENT DOCUMENTS

| | | | |
|---|---|---|---|
| 4,001,609 | 1/1977 | Sickert | 307/272.3 |
| 4,697,097 | 9/1987 | Rusznyak | 307/350 |
| 4,902,910 | 2/1990 | Hsieh | 307/350 |
| 4,983,857 | 1/1991 | Steele | 307/272.3 |
| 5,032,825 | 7/1991 | Kuznicki | 340/825.44 |

Primary Examiner—Edward F. Urban
Assistant Examiner—Nguyen Vo
Attorney, Agent, or Firm—Gregg E. Rasor

[57] ABSTRACT

A selective call receiver (100) operates to recover an information signal and is capable of receiving a battery supplying a first voltage (203) that is multiplied to generate a second voltage (212). The selective call receiver (100) includes [comprises] a processor (106) that extracts message information contained within the recovered information signal for presentation and a power-on reset circuit (112) that generates a power-on reset signal having [comprising] first and second portions corresponding with a processor reset and a processor execute state, respectively. The power-on reset signal changes from the processor reset to the processor execute state when the second voltage (212) exceeds a sum of a PMOS threshold voltage and a NMOS threshold voltage, thereby completing a power-on reset of the processor (106).

5 Claims, 2 Drawing Sheets

SELECTIVE CALL RECEIVER HAVING CMOS POWER-ON RESET CIRCUIT

FIELD OF THE INVENTION

This invention relates in general to power-on reset circuitry and more particularly to a CMOS power-on reset circuit for use in conjunction with a selective call receiver.

BACKGROUND OF THE INVENTION

In portable battery operated products such as a selective call receiver, it is sometimes necessary to use active components requiring voltages higher than produced by a single conventional battery such as a AA, AAA, watch cell, or the like. Volumetric size constraints in present state of the art selective call receivers dictate that additional batteries cannot be accommodated. Hence, designers have opted instead to use a conventional voltage multiplier to supply the higher voltages. The use of voltage multipliers brought about other problems such as their voltage variation versus temperature and the finite time necessary stabilize their multiplied output voltage. Accordingly, any voltage sensitive circuitry powered by the multiplier should be kept inactive during the stabilization period or unpredictable operation could occur.

Conventional power-on reset circuitry addressed these problems by sampling the multiplied voltage output and holding voltage sensitive circuitry in an inactive state during the stabilization period. These prior-art power-on reset systems typically comprise a complex analog comparator with hysteresis and a separate temperature compensated precision voltage reference. The comparator operates to compare the precision voltage reference to the magnitude of the multiplied output voltage, and release a reset signal when the multiplied output voltage reaches a value allowing proper operation of the voltage sensitive circuitry. This approach functions acceptably but at a cost of higher current drain and increased circuit complexity in the temperature compensated precision voltage reference, neither of which can be tolerated in present state of the art selective call receiver systems. Moreover, using conventional integrated circuit processing and technology, it is difficult if not impossible to construct a comparator with controllable hysteresis that operates effectively from a single power cell having a nominal voltage of substantially 1.0 volts DC. Many attempts have been made to overcome this problem, but none has been successful.

Thus, what is needed is an intrinsically temperature compensated voltage detector capable of providing a power-on reset signal denoting when the multiplied output voltage reaches a value allowing proper operation of the voltage sensitive circuitry.

SUMMARY OF THE INVENTION

Briefly, according to the invention, there is provided a selective call receiver that operates to recover an information signal and is capable of receiving a battery supplying a first voltage that is multiplied to generate a second voltage. The selective call receiver comprises a processor that extracts message information contained within the recovered information signal for presentation and a power-on reset circuit that generates a power-on reset signal comprising first and second portions corresponding with a processor reset and a processor execute state, respectively. The power-on reset signal changes from the processor reset to the processor execute state when the second voltage exceeds a sum of a PMOS threshold voltage and a NMOS threshold voltage, thereby completing a power-on reset of the processor.

DESCRIPTION OF A PREFERRED EMBODIMENT

Figure 1:
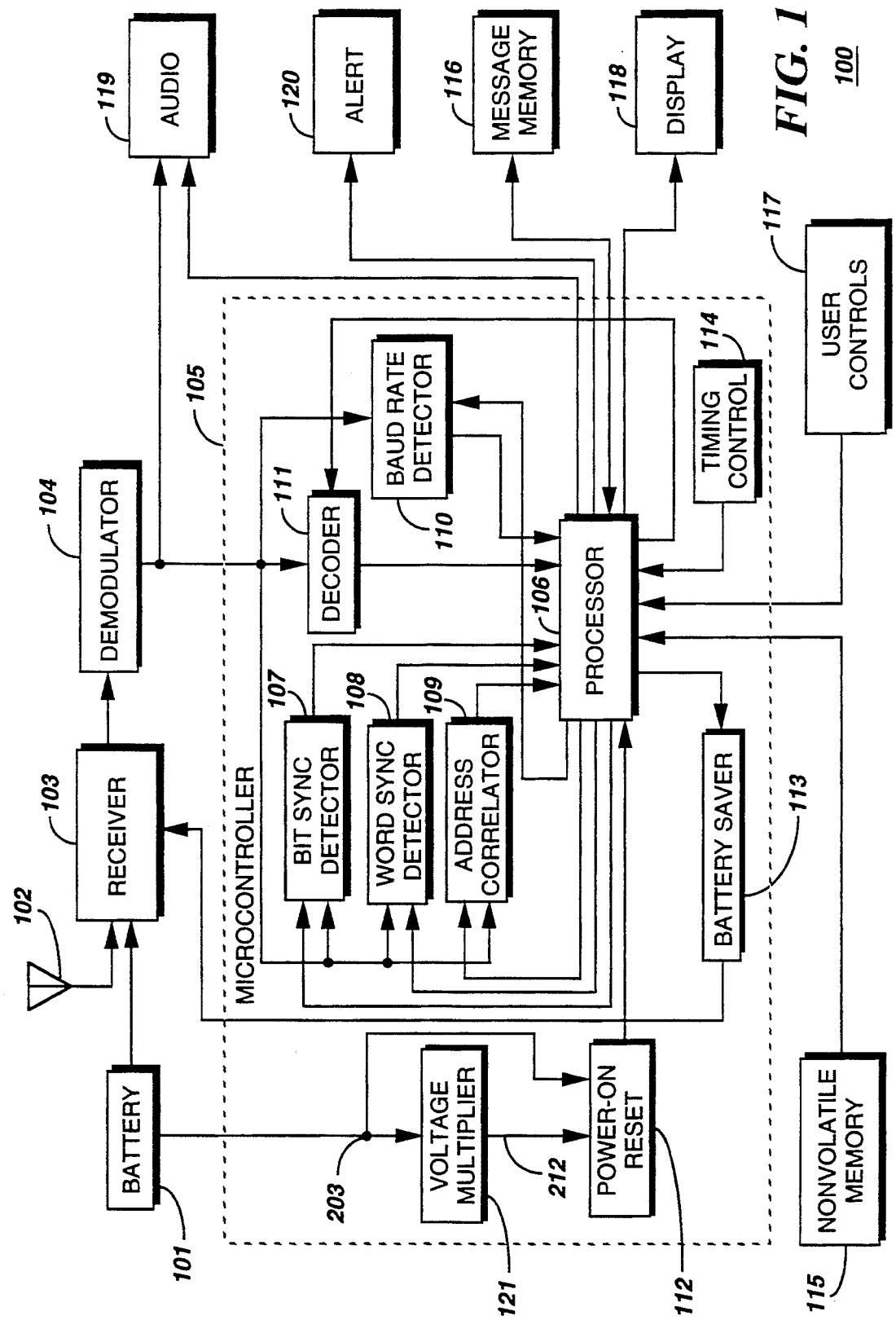
FIG. 1 is a block diagram of a selective call receiver capable of embodying a CMOS power-on reset circuit in accordance with the present invention.

Referring to FIG. 1, a battery 101 powered selective call receiver 100 operates to receive a signal via an antenna 102. A receiver 103 couples the received signal to a conventional demodulator 104 that is capable of recovering analog or digital information as an information signal. Received digital information is recovered from the information signal as a serial bit stream that is coupled to a microcontroller 105 for interpreting and decoding the serial bit stream as address, control, and data signals. In the preferred embodiment, the microcontroller 105 may comprise a processor 106, a bit synchronization detector 107, a word synchronization detector 108, an address correlator 109, a baud rate detector 110, a data decoder 111, a power-on reset circuit 112, a battery saver control 113, and a timing control 114, implemented in hardware, software, or a combination thereof. Examples of commercially available microcontrollers suitable for implementing the preferred embodiment of the present invention are Motorola's MC68HC05xx or M68HC11xx. Complete descriptions of these devices are available in Motorola's data book set entitled "Microprocessor, Microcontroller, and Peripheral Data," volumes I and II, Series A, © 1988 by MOTOROLA, INC. Alternatively, the microcontroller may be constructed as a custom and/or standard cell ASIC (application specific integrated circuit). Using an ASIC would allow the functional components (e.g., a decoder, timing and/or synchronization circuitry, or a frequency synthesizer) to be specifically tailored to match the intended application.

More specifically, in the microcontroller 105 the serial bit stream is coupled to the baud rate detector 110 that determines a receiving data rate associated with the recovered information. When the receiving data rate is determined, the bit synchronization detector 107 establishes synchronization between the microcontroller's 105 data decoding components (106, 109, and 111) and the individual signals (e.g., address, control, and data signals) in the recovered information. Once bit synchronization is established, the word synchronization detector 108 searches the serial bit stream for information indicating the beginning of a batch or frame. When the microcontroller 105 has established both bit and word synchronization, the recovered information is searched for a group identification code associated with the selective call receiver. When the selective call receiver's group identification code is found, the receiver will search only those code frames associated with the receiver's group for pages intended for the selective call receiver. During the period between like frames, the microcontroller 105 will "shut-down" the receiver 103 and demodulator 104, thereby conserving battery power. The predetermined interval between like frames is known in the art as a "sleep" period. Since the system protocol is designed such that pages targeted for a specific group identifier, of which each selective call receiver is a member of at least one group, are sent only during the transmission of that group, no pages are missed during the sleep period. A receiver that operates in the fashion discussed above is said to be operating in a "battery saving" mode.

In determining the selection of a particular selective call receiver, an address correlator performs a correlation between a recovered address contained within the information signal and a predetermined address or addresses corresponding with the selective call receiver. The predetermined address or addresses are stored in a non-volatile memory 115 or code plug that may optionally reside in a support integrated circuit (not shown) or the microcontroller 105. The non-volatile memory 115 typically has a plurality of registers for storing a plurality of configuration words that characterize the operation of the selective call receiver. When the addresses substantially correlate, the address correlator generates a detect signal indicating selection of the selective call receiver. In response the detect signal, the processor 106 operates to extract message information from the information signal for presentation or storage. In conjunction with the associated components in the microcontroller 105 and further in response to the detect signal, the processor 106 may in a tone-only mode activate an alert 120. Alternatively, if a data (numeric or alphanumeric) address is received, the processor 106 may operate to couples message information from the decoder 111 to the message memory 116.

In accordance with the recovered information, and settings associated with the user controls 117, the selective call receiver presents at least a portion of the message information, such as by a display 118 or an audio section 119, and signals the user via an audible, visual, or tactile alert 120 that a message has been received. The user may view information that is automatically presented on the display 118 or manually presented in response to activating the appropriate user controls 117.

The microcontroller 105 may also include items such as a conventional signal multiplexer, a conventional low-power voltage multiplier 121 and/or regulator with a control mechanism, a current regulator and control mechanism (not shown), environmental sensing circuitry (not shown) such as for light or temperature conditions, audio power amplifier circuitry (not shown), control interface circuitry (not shown), and display illumination circuitry (not shown). These elements are arranged in a known manner to provide an information receiver as requested by a customer.

Figure 2:
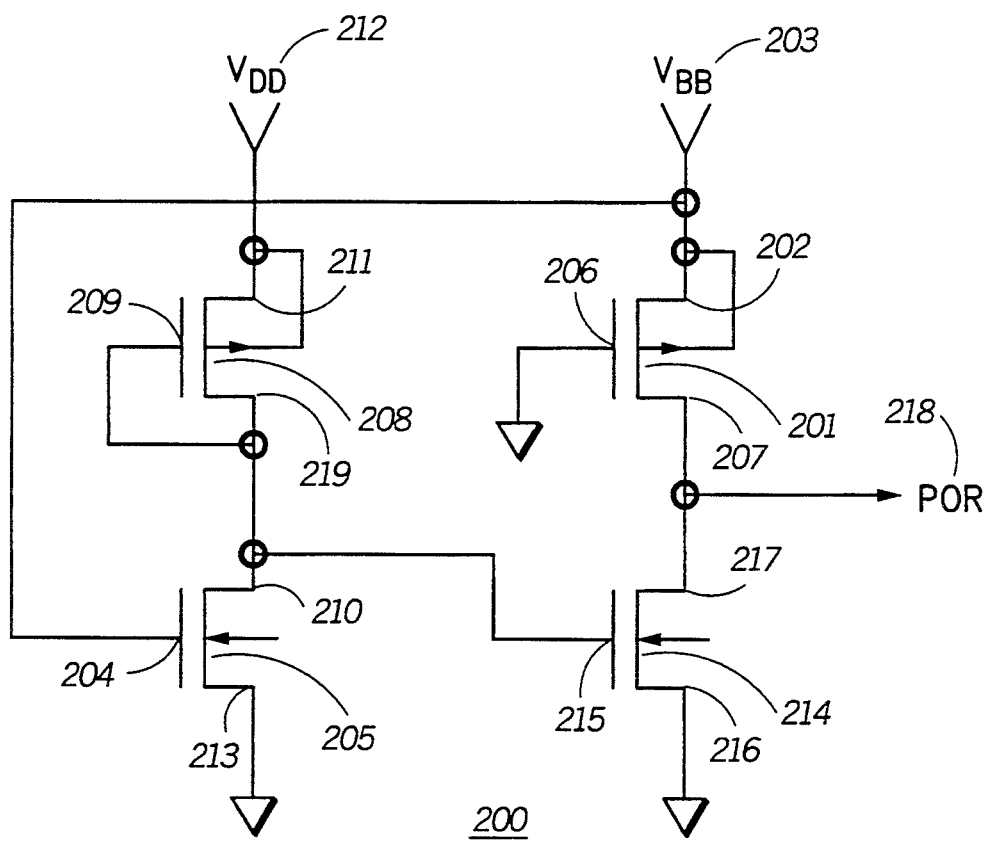
FIG. 2 is a schematic diagram showing an exemplary implementation of the CMOS power-on reset circuit in accordance with the preferred embodiment of the present invention.

Referring to FIG. 2, the schematic diagram shows an exemplary implementation of the CMOS power-on reset circuit in accordance with the preferred embodiment of the present invention. Presently, conventional selective call receivers use microcontrollers or ASIC's that typically require three to five volts DC for operation. In order to supply power to these conventional (or unconventional) components, most state of the art selective call receivers employ a conventional voltage multiplier that generates three to five volts DC from a single battery voltage of substantially 1.0 to 1.5 volts DC. In the preferred embodiment of the present invention, the selective call receiver depicted in FIG. 1 is capable of receiving a battery the supplies a first voltage of substantially 1.0 to 1.5 volts DC. The selective call receiver includes a voltage multiplier 121 that may generate a second voltage of substantially 2.0 to 2.5 volts DC from the first voltage, the second voltage being used to power a low-power processor 106 or the like. In an alternate embodiment, the voltage multiplier 121 may be configured to generate a second voltage of substantially 5.0 to 5.5 volts DC to power a conventional microprocessor (not shown) or the like. As one of ordinary skill in the art can clearly discern, the second voltage is purely a matter of design choice related to the intended application.

Schematically, the power-on reset circuit 200 comprises a first PMOS transistor 201 having a first terminal 202 coupled to the first voltage 203 and to a control terminal 204 of a first NMOS transistor 205. The first PMOS transistor 201 also has a control terminal 206 coupled to a ground reference and a second terminal 207 that provides the first portion of the power-on reset signal. As one of ordinary skill can see, the power-on reset circuit can still be made to function if control terminal 206 of the first PMOS transistor 201 is coupled to an alternate voltage source, e.g., other than ground. A second PMOS transistor 208 has a control terminal 209 and a first terminal 219 coupled to a first terminal 210 of the first NMOS transistor 205. The second PMOS transistor 208 also has a second terminal 211 coupled to the second voltage 212. The first NMOS transistor 205 also has a second terminal 213 coupled to a ground reference. A second NMOS transistor 214 has a control terminal 215 coupled to the first terminal 210 of the first NMOS transistor 205, a first terminal 216 coupled to the ground reference, and a second terminal 217 that provides the second portion of the power-on reset signal.

Operationally, the power-on reset circuit generates a power-on reset signal comprising a processor reset and a processor execute state. The power-on reset signal changes from the processor reset to the processor execute state when the second voltage exceeds a sum of a PMOS threshold voltage and a NMOS threshold voltage, thereby completing a power-on reset of the processor 106.

More specifically, the instant invention uses the intrinsic characteristics of the PMOS and NMOS transistors to generate a power-on reset signal. Initially, when the first voltage is available but the second voltage is zero or has not reached a value exceeding the sum of the device threshold voltages $V_{tn}+V_{tp}$, ($V_{tn}$ denoting the NMOS threshold and $V_{tp}$ denoting the PMOS threshold), the power-on reset signal has a value of substantially the first voltage. The signal state can be deduced by inspection of FIG. 2. Assuming the first voltage 203 is substantially 1.0 volts DC and the second voltage 212 is zero volts DC, the second PMOS transistor 208 is cut-off, the first NMOS transistor 205 turns on grounding the control node 215 of the second NMOS transistor 214, thus presenting the first voltage 203 coupled through the first PMOS transistor 201 at terminal POR 218. This voltage value represents processor reset state. As the output voltage 212 from the voltage multiplier 121 exceeds $V_{tn}+V_{tp}$, both the second PMOS transistor 208 and the first NMOS transistor 205 saturate yielding the following conditions:

$$I_1 = \beta_p(V_a - V_{dd} - V_{tp})^2 = \beta_p[V_{dd} - (V_a + |V_{tp}|)]^2 \qquad [1]$$

and $$I_2 = \beta_n (V_{bb} - V_{tn})^2 \quad [2]$$

where:
$I_1$=PMOS transistor drain to source current (amps)
$I_2$=NMOS transistor drain to source current (amps)
$V_{dd}$=supply or second voltage 212 (volts)
$V_{bb}$=battery or first voltage 203 (volts)
$V_a$=node voltage at the first terminal 210 of the first NMOS transistor 205 (volts)
$V_{tp}$=PMOS threshold voltage (volts)
$V_{tn}$=NMOS threshold voltage (volts)
$\beta_p$=transconductance parameter of PMOS (amps/volt$^2$)
$\beta_n$=transconductance parameter of NMOS (amps/volt$^2$), and the variables $\beta_p$ and $\beta_n$ can be represented as:

$$\beta_p = \left( \mu_p \frac{C_{ox}}{2} \right) \frac{W_1}{L_1} \quad [3]$$

and $$\beta_n = \left( \mu_n \frac{C_{ox}}{2} \right) \frac{W_2}{L_2} \quad [4]$$

where:
$\mu_p$=surface charge mobility in PMOS device channel (meters$^2$/volt.second)
$\mu_n$=surface charge mobility in NMOS device channel (meters$^2$/volt.second)
$C_{ox}$=capacitance per unit area of gate oxide (Farads/meter$^2$)
$W_i$=effective channel width (meters)
$L_i$=effective channel length (meters).

Since $I_1 = I_2$, equations [1] and [2] are set equal to each other and equations [3] and [4] are substituted for their corresponding terms yielding:

$$\beta_p [V_{dd} - (V_a + |V_{tp}|)]^2 = \beta_n (V_{bb} - V_{tn})^2 \quad [5]$$

that can be solved for $V_a$ yielding:

$$V_a = V_{dd} - |V_{tp}| + \sqrt{\frac{\beta_n}{\beta_p}} (V_{tn} - V_{bb}) \quad [6]$$

which can be reduced to a valid approximation giving:

$$V_a \approx V_{dd} - |V_{tp}| \quad [7]$$

under the following conditions:

$$V_{dd} \geq V_{tn} + |V_{tp}| \quad [8]$$

and $$V_a \geq V_{tn} \quad [9]$$

therefore, the second NMOS transistor 214 turns on since the voltage present at its control terminal 215 coupled from the first terminal 210 of the first NMOS transistor 205 is greater than the respective threshold voltage of the first NMOS transistor 205. Accordingly, the second NMOS transistor 214 substantially grounds terminal POR 218. This voltage value represents the processor execute state thus allowing proper operation of voltage sensitive circuitry.

Use of the MOS device threshold characteristics to determine a power-on reset threshold is particularly advantageous when the power-on reset circuit is fabricated on the same substrate as the processor 106 or ASIC (not shown), since all devices on a common substrate tend to track both their voltage and process variations, thereby yielding a more reliable and manufacturable voltage detector capable of providing a power-on reset signal. Moreover, the device operating point variation versus temperature can be made to track out, yielding a net zero variation in other critical operating parameters. Accordingly, this topology better protects and insures more consistent operation of any voltage sensitive circuitry powered by a voltage multiplier by accurately detecting when the multiplied output voltage reaches a value allowing proper operation of the voltage sensitive circuitry.

We claim:

1. A selective call receiver that operates to recover an information signal and is powered by a battery supplying a first voltage that is multiplied to generate a second voltage, the selective call receiver comprising:

a processor that extracts message information contained within the recovered information signal for presentation, the processor operating from the second voltage; and a power-on reset circuit coupled to the processor for generating a power-on reset signal comprising first and second portions corresponding with a processor reset and a processor execute state, respectively, the power-on reset signal changing from the processor reset to the processor execute state when the second voltage exceeds a sum of a PMOS transistor threshold voltage and a NMOS transistor threshold voltage, thereby completing a power-on reset of the processor, the power-on reset circuit comprising:

a first PMOS transistor having a first terminal coupled to the first voltage and to a control terminal of a first NMOS transistor, the first PMOS transistor further having a control terminal coupled to a ground reference and a second terminal providing the first portion of the power-on reset signal;

a second PMOS transistor having a control terminal and a first terminal coupled to a first terminal of the first NMOS transistor, the second PMOS transistor further having a second terminal coupled to the second voltage, and the first NMOS transistor further having a second terminal coupled to a ground reference, the second PMOS transistor having the PMOS transistor threshold voltage; and a second NMOS transistor having a control terminal coupled to the first terminal of the first NMOS transistor, a second terminal coupled to the ground reference, and a first terminal providing the second portion of the power-on reset signal, the second NMOS transistor having the NMOS transistor threshold voltage.

2. The selective call receiver according to claim 1 wherein the power-on reset signal changes from the processor execute to the processor reset state when the second voltage drops below the sum of the PMOS transistor threshold voltage and the NMOS transistor threshold voltage.

3. A selective call receiver powered by a battery supplying a first voltage, the selective call receiver including a voltage multiplier that generates a second voltage from the first voltage, the selective call receiver comprising:

a receiver that provides a received signal;

a demodulator that recovers an information signal from the received signal;

an address correlator that correlates a recovered address contained within the information signal with a predetermined address corresponding to the selective call receiver, and in response to said recovered and predetermined addresses substantially correlating, the address correlator generates a detect signal indicating selection of the selective call receiver;

a processor that in response to the detect signal, extracts message information contained within the information signal for presentation, the processor operating from the second voltage; and a power-on reset circuit coupled to the processor for generating a power-on reset signal comprising a processor reset and a processor execute state, the power-on reset signal changing from the processor reset to the processor execute state when the second voltage exceeds a sum of a PMOS transistor threshold voltage and a NMOS transistor threshold voltage, thereby completing a power-on reset of the processor indicating availability of the second voltage for powering the processor, the power-on reset circuit comprising:

a first PMOS transistor having a first terminal coupled to the first voltage and to a control terminal of a first NMOS transistor, the first PMOS transistor further having a control terminal coupled to a ground reference and a second terminal providing the first portion of the power-on reset signal;

a second PMOS transistor having a control terminal and a first terminal coupled to a first terminal of the first NMOS transistor, the second PMOS transistor further having a second terminal coupled to the second voltage, and the first NMOS transistor further having a second terminal coupled to a ground reference, the second PMOS transistor having the PMOS transistor threshold voltage; and a second NMOS transistor having a control terminal coupled to the first terminal of the first NMOS transistor, a second terminal coupled to the ground reference, and a first terminal providing the second portion of the power-on reset signal, the second NMOS transistor having the NMOS transistor threshold voltage.

4. A selective call receiver that operates to recover an information signal and is powered by a battery supplying a first voltage that is multiplied to generate a second voltage, the selective call receiver comprising:

a processor that extracts message information contained within the recovered information signal for presentation, the processor operating from the second voltage, the processor including a power-on reset circuit that generates a power-on reset signal comprising first and second portions corresponding with a processor reset and a processor execute state, respectively, the power-on reset signal changing from the processor reset to the processor execute state when the second voltage exceeds a sum of a PMOS transistor threshold voltage and a NMOS transistor threshold voltage, thereby completing a power-on reset of the processor, the power-on reset circuit comprising:

a first PMOS transistor having a first terminal coupled to the first voltage and to a control terminal of a first NMOS transistor, the first PMOS transistor further having a control terminal coupled to a ground reference and a second terminal providing the first portion of the power-on reset signal;

a second PMOS transistor having a control terminal and a first terminal coupled to a first terminal of the first NMOS transistor, the second PMOS transistor further having a second terminal coupled to the second voltage, and the first NMOS transistor further having a second terminal coupled to a ground reference, the second PMOS transistor having the PMOS transistor threshold voltage; and a second NMOS transistor having a control terminal coupled to the first terminal of the first NMOS transistor, a second terminal coupled to the ground reference, and a first terminal providing the second portion of the power-on reset signal, the second NMOS transistor having the NMOS transistor threshold voltage.

5. The selective call receiver according to claim 4 wherein the power-on reset signal changes from the processor execute to the processor reset state when the second voltage drops below the sum of the PMOS transistor threshold voltage and the NMOS threshold voltage.

* * * * *